United States Patent
Zhang et al.

(10) Patent No.: US 8,054,135 B2
(45) Date of Patent: Nov. 8, 2011

(54) CLASS-E AMPLIFIER AND LIGHTING BALLAST USING THE AMPLIFIER

(75) Inventors: Yingqi Zhang, Shanghai (CN); Jianwu Li, Solon, OH (US); Yunfeng Liu, Shanghai (CN); Wuhua Li, Shanghai (CN)

(73) Assignee: General Electric Company, Niskayuna, NY (US)

( * ) Notice: Subject to any disclaimer, the term of this patent is extended or adjusted under 35 U.S.C. 154(b) by 536 days.

(21) Appl. No.: 12/328,880

(22) Filed: Dec. 5, 2008

(65) Prior Publication Data

US 2010/0141168 A1 Jun. 10, 2010

(51) Int. Cl.
*H03F 3/04* (2006.01)
*H02J 3/38* (2006.01)

(52) U.S. Cl. ........ 330/296; 330/297; 330/286; 330/277; 330/252; 327/530; 327/545; 327/563; 327/524

(58) Field of Classification Search ................... 327/524, 327/530, 534–543, 563; 330/296, 297, 290, 330/278, 273, 286, 277, 302
See application file for complete search history.

(56) References Cited

U.S. PATENT DOCUMENTS

| | | | |
|---|---|---|---|
| 5,592,122 A * | 1/1997 | Masahiro et al. | 330/286 |
| 6,784,732 B2 | 8/2004 | Hajimiri et al. | |
| 7,397,676 B2 | 7/2008 | Lincoln et al. | |
| 2003/0139159 A1 * | 7/2003 | Young | 455/217 |
| 2010/0283544 A1 * | 11/2010 | Ishikawa et al. | 330/277 |

OTHER PUBLICATIONS

Woo et al., "Voltage-Clamped Class-E Inverter With Harmonic Tuning Network for Magnetron Drive", Member, IEEEIEEE Transactions on Circuits and Systems—II: Express Briefs, vol. 53, No. 12, Dec. 2006.
Imury et al, "Inverse Class-E Amplifier With Transmission-Line Harmonic Suppression", Fellow, IEEE Transactions on Circuits and Systems—I: Regular Papers, vol. 54, No. 7, Jul. 2007.

\* cited by examiner

*Primary Examiner* — Tuyet Thi Vo
(74) *Attorney, Agent, or Firm* — Jason K. Klindtworth

(57) ABSTRACT

An amplifier comprises a power source, a load network comprising a load and a resonance circuit, an input branch having a first end electrically coupled to the power source and a second end electrically coupled to the load network, and an active switch having one terminal electrically coupled to the second end of the input branch. The input branch including at least one parallel-LC-circuit configured to provide an infinitely large impedance at harmonics of a determined order.

20 Claims, 6 Drawing Sheets

CLASS-E AMPLIFIER AND LIGHTING BALLAST USING THE AMPLIFIER

BACKGROUND

Embodiments of the invention are generally related to the field of electronic amplifiers and electronic devices using the amplifiers, and more particularly, to a Class-E amplifier and a lighting ballast using the Class-E amplifier.

Class-E amplifiers are highly efficient switching power amplifiers, operating at high frequencies. Referring to FIG. 1, a typical class-E amplifier 10 includes a transistor 12, such as a metal-oxide-silicon field-effect transistor (MOSFET), connected via a serial-LC-circuit 14 to a load 16, and connected via a large inductor 18 to a power source 20. Capacitor 22 represents parasitic capacitance of the transistor 12 or may include an additional capacitor. At an ON stage of the MOSFET, the voltage across the MOSFET is close to zero, and when the MOSFET is OFF, the current through the MOSFET is close to zero. Together with capacitor 22, the serial-LC-circuit 14 shapes the voltage and current waveforms to prevent simultaneous high voltage and high current in the transistor 12, that minimizes power dissipation, especially during the switching transitions. Accordingly a significant advantage of Class-E amplifiers is lower power dissipation resulting in higher efficiency. On the other hand, the class E amplifier generates substantial harmonic energy while inducing a high peak voltage for the MOSFET drain, which causes a risk of damage to the MOSFET.

It is desirable to have an improved Class-E amplifier with harmonic reduction design.

BRIEF DESCRIPTION

In accordance with an embodiment disclosed herein, an amplifier comprises a power source, a load network comprising a load and a resonance circuit, an input branch having a first end electrically coupled to the power source and a second end electrically coupled to the load network, and an active switch having one terminal electrically coupled to the second end of the input branch. The input branch including at least one parallel-LC-circuit configured to provide an infinitely large impedance at harmonics of a determined order.

In accordance with another embodiment disclosed herein, a ballast circuit comprises a direct current power supply, an amplifier circuit comprising an input branch circuit electrically coupled to the direct current power supply to convert a direct current from the direct current power supply into an output alternating current signal, an inductor coil to receive the output alternating current signal from the amplifier and generate a magnetic field, and a lighting device filled with ionizable gas coupled to the magnetic field to generate an arc discharge in response to the magnetic field. The input branch circuit of the amplifier circuit includes a harmonics reduction circuit with an infinitely large impedance to a determined order of harmonics.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments disclosed herein relate to a Class-E amplifier which includes an input branch with one end connected to a power source and another end connected to an active switch and a load network. The input branch includes a parallel-LC-circuit with high impedance at harmonics of a determined order. Accordingly, such harmonics are prevented from affecting a voltage across the active switch. For purposes of simplicity of description, common elements across different embodiments share the same reference numbers.

Figure 1:
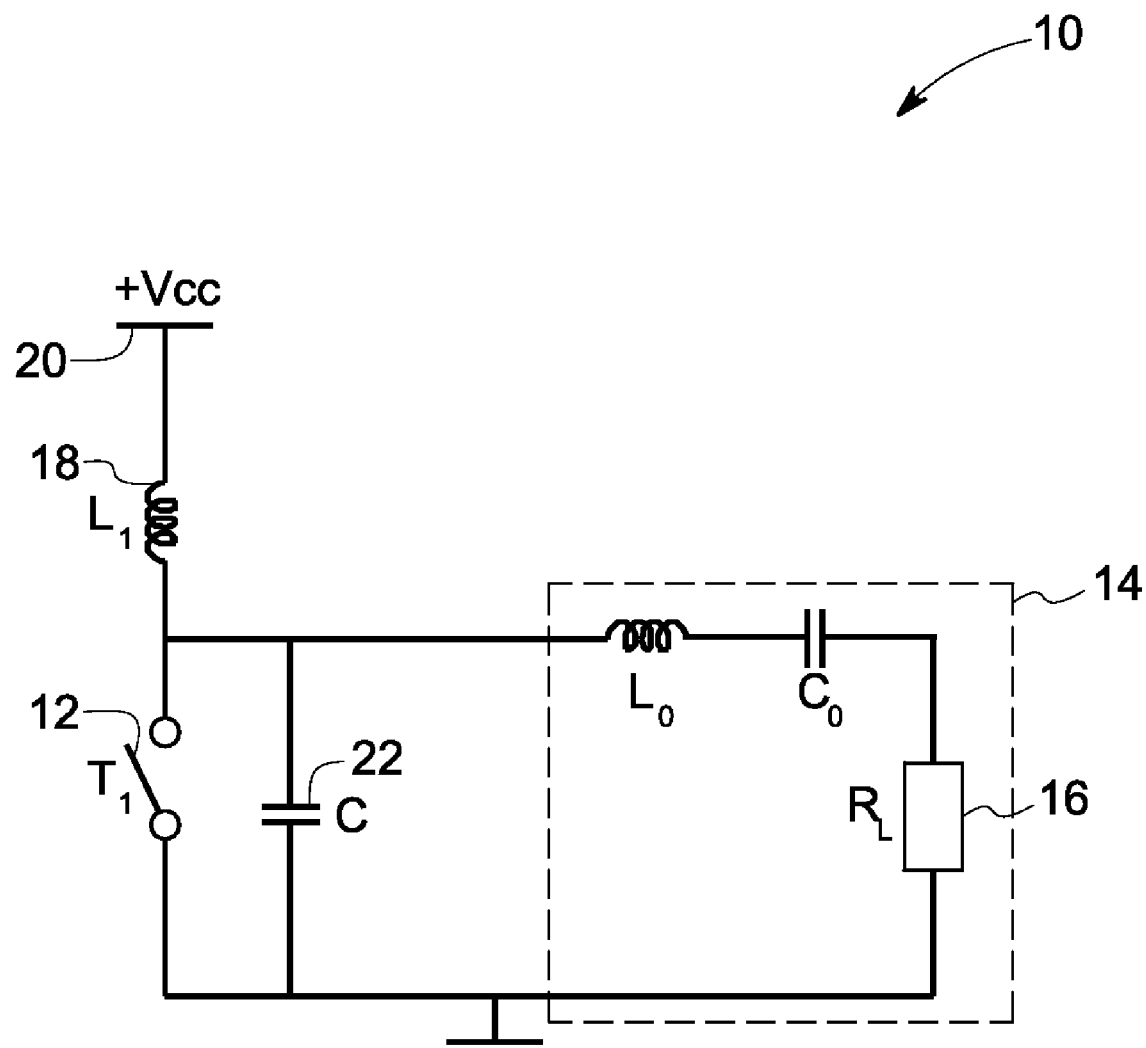
FIG. 1 is an equivalent circuit of a conventional Class-E amplifier.
Figure 2:
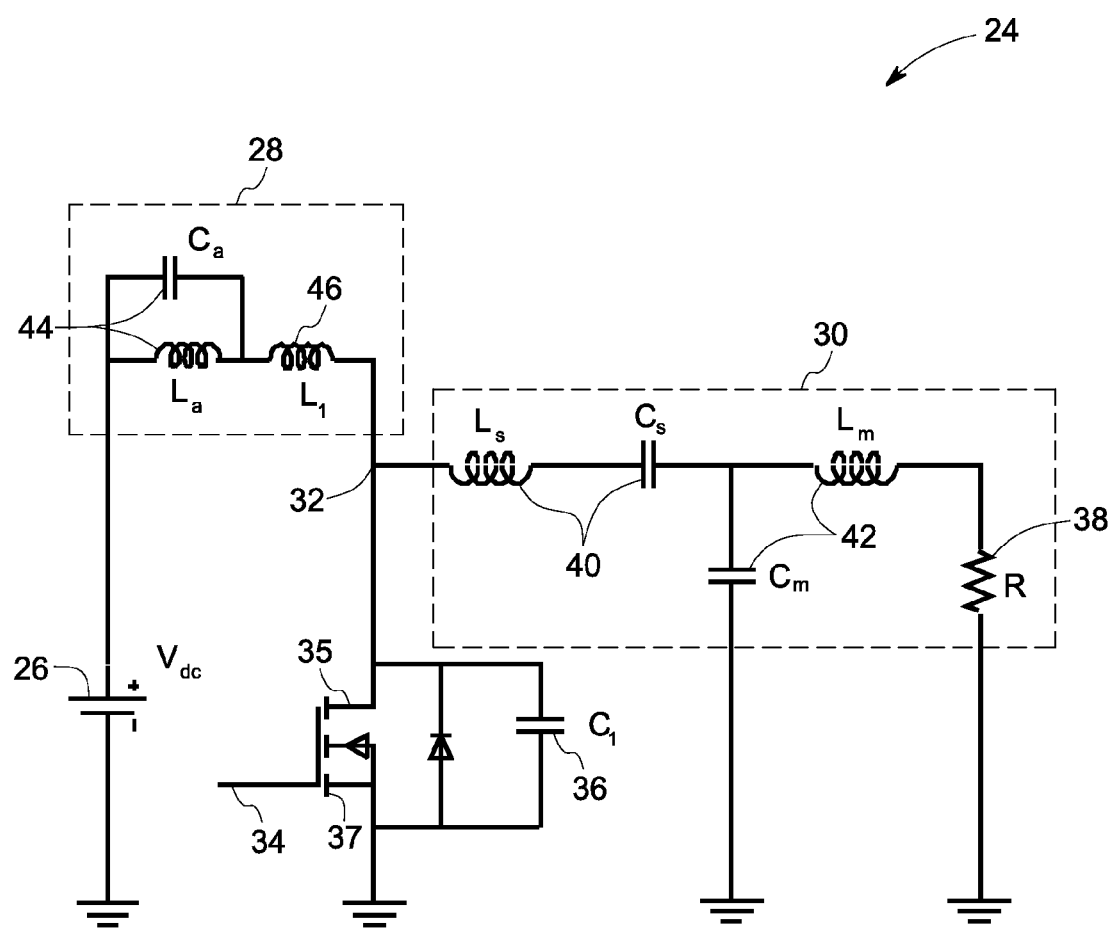
FIG. 2 is an equivalent circuit of a Class-E amplifier according to one embodiment of the invention.

FIG. 2 is an equivalent circuit of an exemplary Class-E amplifier 24 according to one embodiment of the invention. The Class-E amplifier 24 includes a power source 26 for driving a load network 30, an input branch 28 having one end connected to the power source 26 and another end or a drain point 32 connected to the load network 30, and an active switch 34 also connected to the drain point 32 of the input branch 28. In one embodiment, the power source 26 is a direct current (DC) power source. In the illustrated embodiment, the Class-E amplifier 24 further comprises a shunt capacitor 36 connected in parallel with the active switch 34 to serve as a temporary energy storage while the active switch 34 is open. In certain embodiments, the capacitor 36 represents a parasitic capacitance of the active switch 34, or represents a parasitic capacitance of the active switch 34 and an external capacitor.

In one embodiment, the active switch 34 may be a bipolar junction transistor (BJT), a heterojunction bipolar transistor (HBT), a junction field-effect transistor (JFET), a metal-oxide-silicon field-effect transistor (MOSFET), or a metal semiconductor field effect transistor (MESFET). In the exemplary embodiment, the active switch is a MOSFET, and opening and closing of the active switch 34 are controlled by an input signal. In one embodiment, the input signal is a pulsed square waveform with an angular frequency ω. In one embodiment, as shown in FIG. 2, the active switch 34 is a Single Pole Single Throw (SPST) MOSFET with a drain terminal 35 connected to the drain point 32 of the input branch 28, and a source terminal 37 connected to Ground. The voltage at the drain terminal connected to the drain point 32 is also referred to as a "drain voltage" of the active switch 34. The current across the exemplary active switch 34 is thus equal to the drain voltage.

The load network 30 includes a load 38, a resonance circuit 40 (Ls, Cs), and an impedance matching circuit 42 (Lm, Cm). In one embodiment, the resonance circuit 40 comprises a serial-LC-circuit including a serial connected inductor Ls and capacitor Cs. One end of the serial-LC-circuit is connected to the drain point 32 and another end of the serial-LC-circuit is electrically coupled to the impedance matching circuit 42. In one embodiment, the resonance circuit 40 is tuned to have a zero impedance $Z_{LC}$ at the fundamental operating frequency of the active switch 34 as below and provides a relative large impedance for harmonics:

$$Z_{LC} = \frac{1}{\frac{1}{\omega L_S} - \omega C_S} = 0$$

wherein Ls is a length of the inductor Ls, Cs is the capacitance of the capacitor Cs, and ω is the angular switching frequency of the active switch 34. The resonance circuit 40 provides a high purity of a uniform sine wave output to the load 38.

In one embodiment, the impedance matching circuit 42 is coupled between the resonance circuit 40 and the load 38, and includes an inductor $L_m$ and a capacitor $C_m$ connected in parallel. The impedance matching circuit 42 converts the load impedance to a preferred impedance so that amplifier achieves high efficiency.

In one embodiment, the input branch 28 includes a harmonic reduction circuit (La, Ca) 44, and a tunable inductor (L1) 46 coupled in series between the harmonic reduction circuit 44 and the drain point 32. In one embodiment, the harmonic reduction circuit 44 includes a parallel-LC-circuit comprising an inductor La and a capacitor Ca connected in parallel and is tuned to provide an infinitely large impedance at the determined order harmonics, so that current at the determined order harmonics can not flow through the input branch 28 to the drain terminal of the active switch 34. The serial inductor L1 is tuned so that the switch can achieve zero voltage switching.

Figure 3:
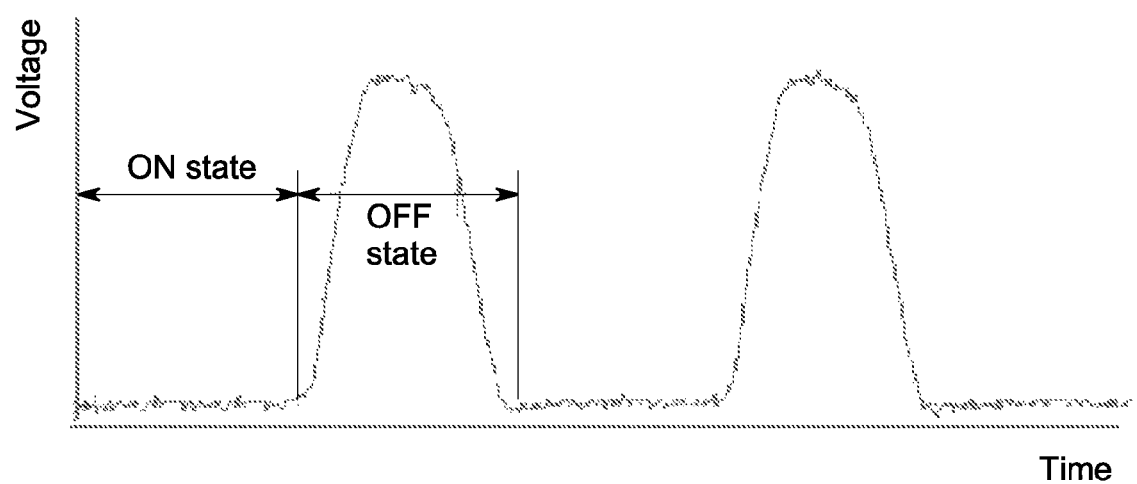
FIG. 3 is a drain voltage diagram of a transistor in a Class-E amplifier.

FIG. 3 illustrates a diagram for the drain voltage of the active switch 34 during operation of the Class-E amplifier 24. Referring to FIGS. 2 and 3, during an ON state of the Class-E amplifier 24, the active switch 34 is closed or in a conduction mode and acts as a low resistance element that permits current to flow through it to the Ground. As such, the drain voltage of the active switch 34 at the drain point 32 is substantially zero. As current flows through the input branch 28 it increases linearly and the inductors La and L1 store energy. Meanwhile, the resonance circuit 40 performs damping oscillation and forces a sinusoidal current through the load 38, which results in a sinusoidal output signal. In certain embodiments, a frequency of the resonance circuit 40 is less than the switching frequency of the active switch 34.

When the control signal for the active switch becomes low, Class-E amplifier enters an "OFF" state. In this state, the active switch 34 acts as a high impedance element. The DC current from the power source 26 and energy stored in the input branch 28 flows through the drain point 32 to charge the shunt capacitor 36, and provides current to the resonance circuit 40 to enable the resonance circuit to continue oscillation. The drain voltage at the drain terminal of the active switch 34 increases until the drain voltage reaches a peak voltage, at which time it starts to decrease. Before the drain voltage reaches zero, the active switch 34 is closed and the Class-E amplifier 24 returns to the ON state. The harmonics reduction circuit components (La, Ca) are selected to provide an infinitely large impedance at the determined order harmonics so as to decrease the peak voltage.

In one embodiment, the harmonics reduction circuit (La, Ca) 44 to provide an infinitely large impedance $Z_2$ at $2^{nd}$ harmonics. The impedance of the harmonics reduction circuit 44 at the $2^{nd}$ harmonics is:

$$Z_2 = \frac{1}{\frac{1}{2\omega L_a} - 2\omega C_a}$$

When $$\frac{1}{2\omega L_a} - 2\omega C_a = 0, \quad Z_2 = \infty.$$

Accordingly, $$L_a = \frac{1}{4\omega^2 C_a},$$

and The $2^{nd}$ harmonic component of the drain voltage of the active switch 34 is suppressed.

At the fundamental frequency of the active switch 34, the harmonics reduction circuit 44, together with the inductor 46, acts as an inductor and the impedance $Z_1$ of the input branch 28 at the fundamental frequency ω is:

$$Z_1 = \frac{1}{\frac{1}{\omega L_a} - \omega C_a} + \omega L_1$$

$$L_a = \frac{1}{4\omega^2 C_a},$$

accordingly, $$Z_1 = \omega \left( \frac{4}{3} L_a + L_1 \right).$$

L1 is adjusted for zero voltage switching of active switch 34.

Figure 4:
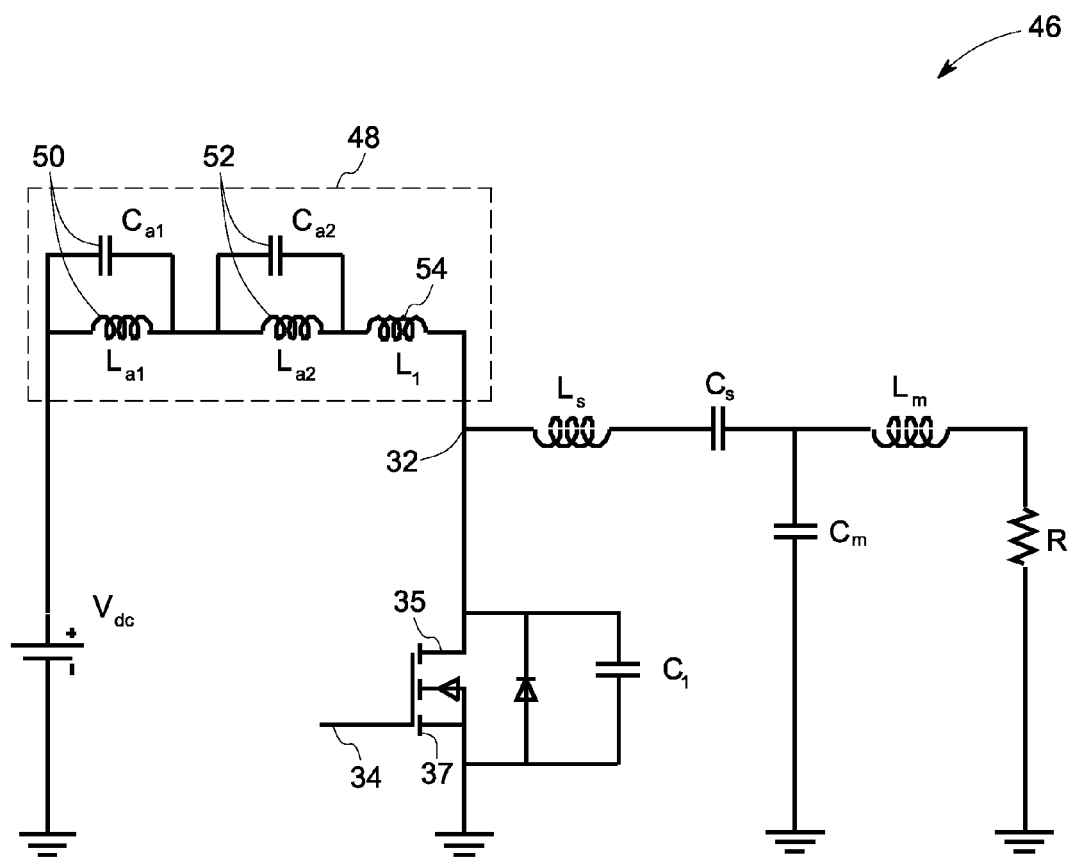
FIG. 4 is an equivalent circuit of a Class-E amplifier according to another embodiment of the invention.

FIG. 4 shows an equivalent circuit of a Class-E amplifier 46 according to another embodiment of the invention. An input branch 48 of the Class-E amplifier 46 includes a first and a second harmonics reduction circuit 50, 52, and a tunable inductor 54 coupled in series with the first and second harmonic reduction circuits 50, 52. The first harmonics reduction circuit 50 includes an inductor and capacitor La1, Ca1 coupled in parallel. The second harmonics reduction circuit 52 includes an inductor and capacitor La2, Ca2 coupled in parallel. The first and second harmonic reduction circuits 50, 52 are selected to respectively provide an infinitely large impedance at harmonics of two different orders to reduce the peak drain voltage of the active switch 34. In one embodiment, the first and second harmonics reduction circuits respectively provide infinitely large impedances at $2^{nd}$ and $4^{th}$ order harmonics. In other embodiments, the input branch may have more than two harmonics reduction circuits to reduce harmonics of more than two orders.

Figure 5:
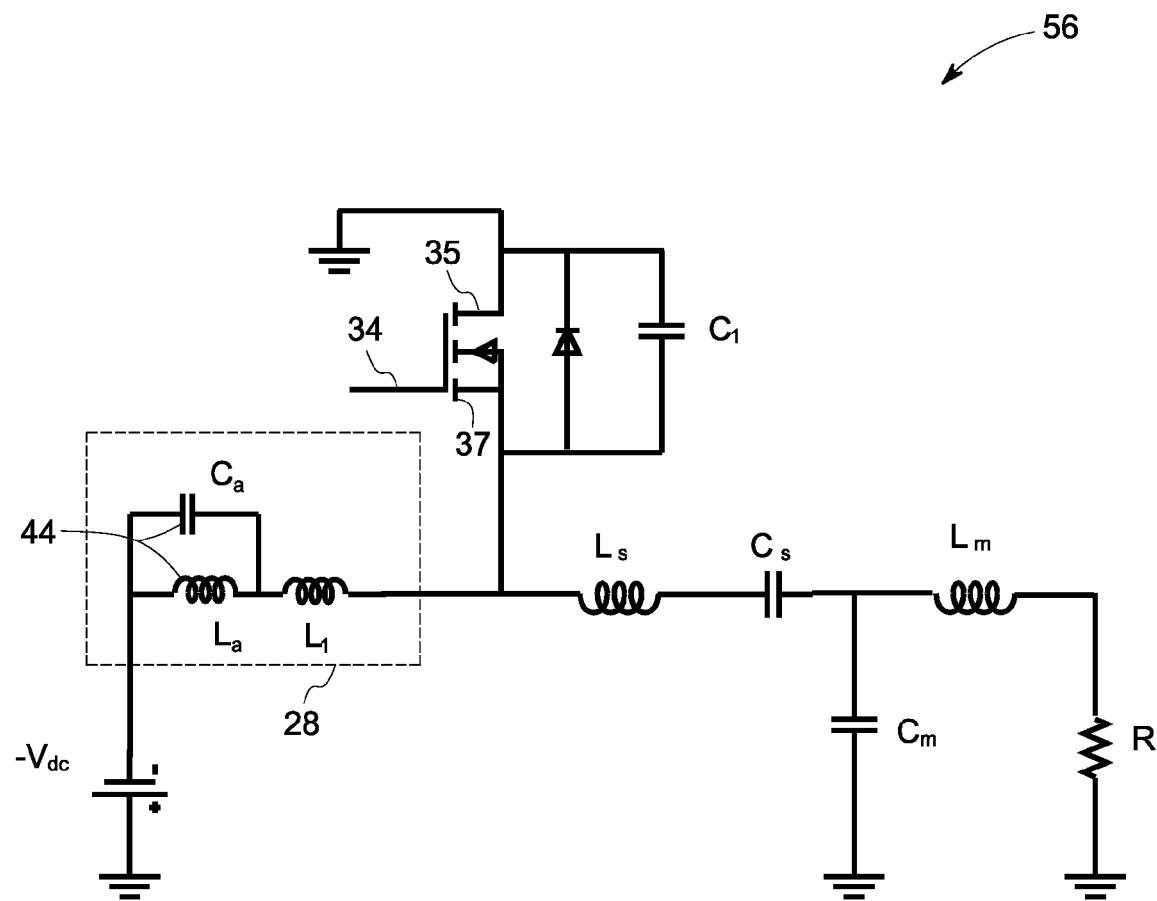
FIG. 5 is an equivalent circuit of a Class-E amplifier according to still another embodiment of the invention.

FIG. 5 illustrates an equivalent circuit of a Class-E amplifier 56 according to still another embodiment of the invention. In the exemplary Class-E amplifier 56, the drain terminal 35 of the active switch 34 is connected to the Ground, and the source terminal 37 of the active switch 34 is electrically coupled to the input branch 28 which includes a harmonics reduction circuit 44. Accordingly, the voltage at the source terminal 37 is the voltage across the active switch 34. The harmonics reduction circuit 44 reduces a determined order harmonics and suppresses a peak voltage at the source terminal 37.

Figure 6:
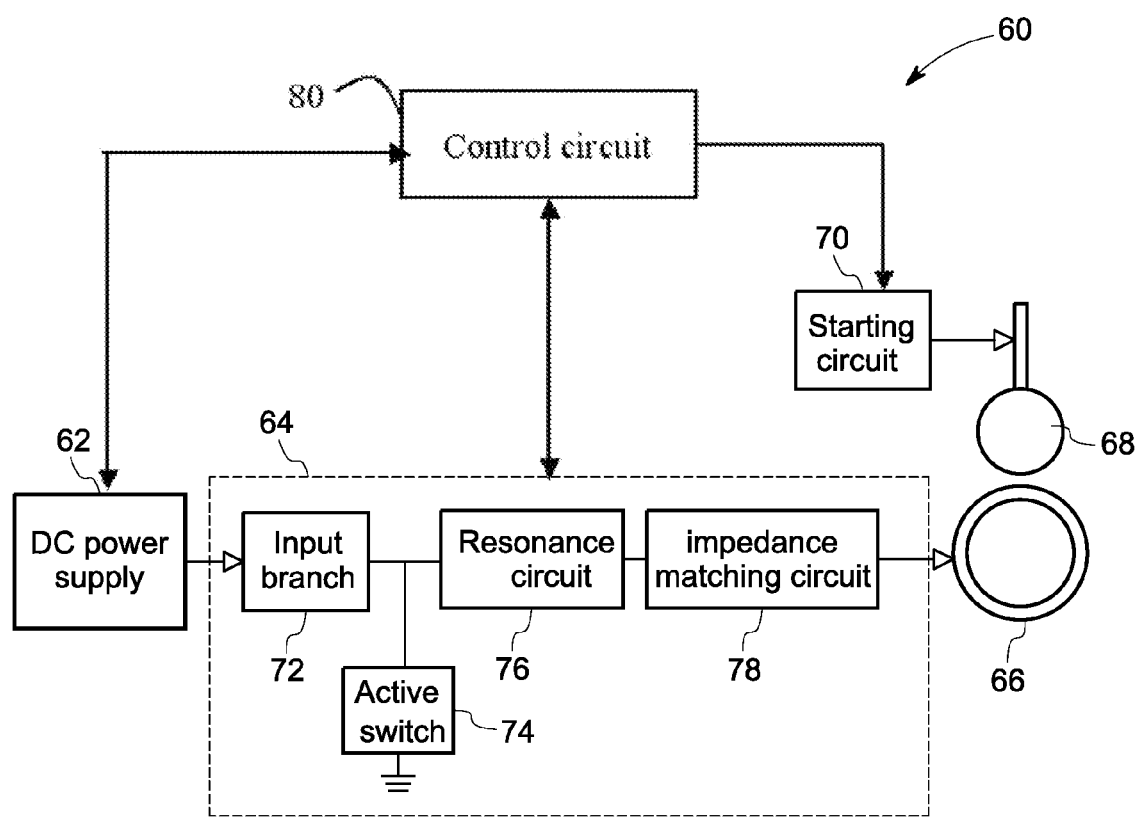
FIG. 6 is a block diagram showing a lighting ballast according to one embodiment of the invention.

In one embodiment, the Class-E amplifier with a harmonic reduction circuit in the input branch is used in a lighting ballast to drive a lighting device. FIG. 6 is a block diagram of an exemplary lighting ballast 60 according to one embodiment of the invention. The lighting ballast 60 includes a DC power supply 62, a Class-E amplifier 64 having an input branch electrically coupled to the DC power supply 62, an inductive coil 66 to receive an alternating current signal from the Class-E amplifier 64, and a lighting device 68 magnetically coupled to the inductive coil 66. In the illustrated embodiment, the Class-E amplifier 64 further includes an input branch 72 to receive power from the DC power supply 62 as well as a resonance, an impedance matching circuit 74 and 76 and an active switch 78 coupled to the input branch 72 as shown. In one embodiment, the input branch 72 of the Class-E amplifier 64 includes a harmonics reduction circuit to provide an infinitely large impedance at a determined order of harmonics as described above with reference to FIGS. 2-5.

In one embodiment, the lighting device 68 is a lamp and is filled with ionizable gas such as Xenon and sodium vapor. The output alternating current signal of the Class-E amplifier 64 generates a time-varying magnetic field in the inductive coil 66, which induces solenoidal electric field. The electric field generates arc discharge in the lighting device 68 to generate light. In one embodiment, the lighting ballast 60 further comprises a starting circuit 70 for generating capacitive discharge in the light device 68 before the lighting device 68 enters into arc discharge.

In one embodiment, the lighting ballast 60 comprises a control circuit 80 communicating with the Class-E amplifier 64, the DC power supply 62 and the starting circuit 70. In one embodiment, the control circuit 80 may be a general purpose processor or other controller configured to store one or more algorithms and receive feedback. The control circuit 80 receives feedback signal from the Class-E amplifier 64 to perform control to send a timing and logic sequence to start the lighting device 68, to adjust the output voltage of the DC power supply 72 for warm up control of the lighting device 68, and to control steady-state power of the lighting device 68. In certain embodiments, the control circuit 80 also sends control signals to adjust variable inductor or capacitor for active tuning of impedance matching circuit 78, and/or change operating frequency of the active switch 74 for dynamic impedance matching.

While there have been described herein what are considered to be preferred and exemplary embodiments of the present invention, other modifications of the invention shall be apparent to those skilled in the art from the teachings herein, and it is, therefore, desired to be secured in the appended claims all such modifications as fall within the true spirit and scope of the invention.

The invention claimed is:

1. An amplifier comprising:
a power source;
a load network comprising a load and a resonance circuit;
an input branch having a first end electrically coupled to the power source and a second end electrically coupled to the load network, the input branch including at least one parallel-LC-circuit configured to provide an infinitely large impedance at harmonics of a determined order; and
an active switch having one terminal electrically coupled to the second end of the input branch.

2. The amplifier of claim 1, wherein the power source is a direct current power source.

3. The amplifier of claim 1, wherein the active switch comprises a terminal coupled to Ground.

4. The amplifier of claim 1 further comprising a shunt capacitor connected in parallel with the active switch.

5. The amplifier of claim 1, wherein the load network further comprises an impedance matching circuit.

6. The amplifier of claim 1, wherein a frequency of the resonance circuit is less than the switching frequency of the active switch.

7. The amplifier of claim 1, wherein the active switch comprises a metal-oxide-silicon field-effect transistor.

8. The amplifier of claim 7, wherein the metal-oxide-silicon field-effect transistor comprises a drain terminal electrically coupled to the second end of the input branch, and a source terminal connected to Ground.

9. The amplifier of claim 7, wherein the metal-oxide-silicon field-effect transistor comprises a source terminal electrically coupled to the second end of the input branch, and a drain terminal connected to Ground.

10. The amplifier of claim 1, wherein the parallel-LC-circuit provides an infinitely large impedance at a second harmonic frequency.

11. The amplifier of claim 1, wherein the input branch includes at least two parallel-LC-circuits coupled in serial, the at least two parallel-LC-circuits respectively providing infinitely large impedances at second order harmonics.

12. The amplifier of claim 11, wherein the at least two parallel-LC-circuits respectively provide infinitely large impedances at $2^{nd}$ and $4^{th}$ harmonics.

13. The amplifier of claim 1, wherein the input branch further comprises a tunable inductor coupled in series with the parallel-LC-circuit.

14. A ballast circuit, comprising:
a direct current power supply;
an amplifier circuit comprising an input branch circuit electrically coupled to the direct current power supply to convert a direct current from the direct current power supply into an output alternating current signal, the input branch circuit including a harmonics reduction circuit with an infinitely large impedance to a determined order of harmonics;
an inductor coil to receive the output alternating current signal from the amplifier, and generate a magnetic field; and
a lighting device filled with ionizable gas coupled to the magnetic field to generate an arc discharge in response to the magnetic field.

15. The circuit according to claim 14 further comprising a starting circuit to provide a starting current for generating capacitive discharge in the lighting device before the lighting device enters into arc discharge.

16. The circuit according to claim 14, wherein the input branch circuit of the amplifier comprises at least one parallel-LC-circuit configured to provide an infinitely large impedance at harmonics of a determined order.

17. The circuit according to claim 14 further comprising a control circuit to provide a timing and logic sequence to start the lighting device.

18. The circuit according to claim 14 further comprising a circuit and algorithm to control the warm up of the lighting device.

19. The circuit according to claim 14 further comprising a control circuit and algorithm to control the power of the lighting device.

20. The circuit according to claim 14 further comprising a control circuit to adjust the impedance matching network.

* * * * *